(12) United States Patent
Sato

(10) Patent No.: US 6,669,074 B2
(45) Date of Patent: Dec. 30, 2003

(54) RESONATOR FOR ULTRASONIC WIRE BONDING

(75) Inventor: Shigeru Sato, Fukuoka-ken (JP)

(73) Assignee: Ultex Corporation, Fukuoka-ken (JP)

( * ) Notice: Subject to any disclaimer, the term of this patent is extended or adjusted under 35 U.S.C. 154(b) by 0 days.

(21) Appl. No.: 10/187,957

(22) Filed: Jul. 3, 2002

(65) Prior Publication Data

US 2003/0006265 A1 Jan. 9, 2003

(30) Foreign Application Priority Data

Jul. 6, 2001 (JP) ........................ 2001-205925

(51) Int. Cl.[7] .............. B23K 1/06; B23K 5/20; B23K 37/00
(52) U.S. Cl. .......................... 228/1.1; 228/4.5
(58) Field of Search .............. 228/1.1, 4.1, 4.5; 219/85.18

(56) References Cited

U.S. PATENT DOCUMENTS

| 5,326,014 | A | | 7/1994 | Morita | |
|---|---|---|---|---|---|
| 5,443,240 | A | * | 8/1995 | Cunningham | 248/638 |
| 5,603,444 | A | * | 2/1997 | Sato | 228/1.1 |
| 5,884,833 | A | * | 3/1999 | Sato et al. | 228/36 |
| 6,109,502 | A | * | 8/2000 | Sato | 228/1.1 |
| 6,168,063 | B1 | * | 1/2001 | Sato et al. | 228/1.1 |
| 6,491,785 | B1 | * | 12/2002 | Sato et al. | 156/379.6 |

FOREIGN PATENT DOCUMENTS

| EP | 0655815 | 5/1995 |
|---|---|---|
| EP | 1074330 | 2/2001 |
| JP | 2001168142 | 6/2001 |
| JP | 2002043377 | 2/2002 |

* cited by examiner

Primary Examiner—M. Alexander Elve
Assistant Examiner—Colleen P. Cooke
(74) Attorney, Agent, or Firm—Kanesaka & Takeuchi

(57) ABSTRACT

The bonding position between a bonding wire and an electrode is maintained accurately, an ultrasonic horn is mounted to a bonding machine by the attachment portions of support portions situated at minimum vibration amplitude points equally distant from a capillary in opposite directions in such a manner that it is supported on both sides, and the ultrasonic horn, capillary and bonding work portion are vibrated by ultrasonic waves to bond the end portion of the bonding wire.

9 Claims, 2 Drawing Sheets

RESONATOR FOR ULTRASONIC WIRE BONDING

BACKGROUND OF THE INVENTION

1. Field of the Invention

The present invention relates to a resonator for ultrasonic bonding used to weld a bonding wire by ultrasonic waves for the production of a semiconductor device.

2. Description of the Prior Art

FIG. 4 shows a prior art ultrasonic bonding machine used for the production of a semiconductor device. When a bonding wire 101 such as a gold wire is caused to pass through a wire path 105 formed in a capillary 104 installed at the end of an ultrasonic horn 103 through a clamper 102, the end of the bonding wire 101 projecting downward from the end of the capillary 104 is moved down together with the ultrasonic horn 103 and the capillary 104 to be placed upon an electrode in an unshown semiconductor device or lead frame to be bonded and sandwiched between the electrode and the capillary 104, and the ultrasonic horn 103 and the capillary 104 are vibrated by ultrasonic waves to bond the end of the bonding wire 101 to the electrode.

However, since the capillary 104 is connected to the end of the ultrasonic horn 103 which is mounted to the ultrasonic bonding machine in such a manner that it is supported on one side in the prior art, the ultrasonic horn 103 is bent by pressure for bonding the bonding wire 101 to the electrode with a support point for the ultrasonic bonding machine as a fulcrum, whereby the bonding position between the bonding wire 101 and the electrode is slightly changed, thereby making it impossible to carry out suitable bonding.

SUMMARY OF THE INVENTION

It is therefore an object of the present invention to provide a resonator for ultrasonic bonding, which is able to carry out suitable bonding by supporting the ultrasonic horn on both side of the capillary to maintain the bonding position between the bonding wire and the electrode accurately.

Since the ultrasonic horn comprises support portions which are situated at minimum vibration amplitude points on both sides of the capillary for passing the bonding wire therethrough in the present invention, the ultrasonic horn is mounted to an unshown bonding machine by the support portions in such a manner it is supported on both sides. Therefore, when the end portion of the bonding wire is sandwiched between an object to be bonded and the capillary by predetermined pressure, the ultrasonic horn is bent at the bonding position between the bonding wire and the object to be bonded by the pressure for bonding the bonding wire to the object to be bonded, thereby making it possible to maintain the bonding position between the bonding wire and the object to be bonded accurately and to bond the bonding wire to the object to be bonded suitably. Since the ultrasonic horn is mounted to the bonding machine in such a manner that it is supported on both sides with the capillary as the center, pressure applied to the bonding wire from the capillary at the time of bonding is well balanced on right and left sides, thereby making it possible to use a thin wire, thick wire or wire coated with a polymer material as the bonding wire.

DETAILED DESCRIPTION OF THE PREFERRED EMBODIMENT

Figure 1:
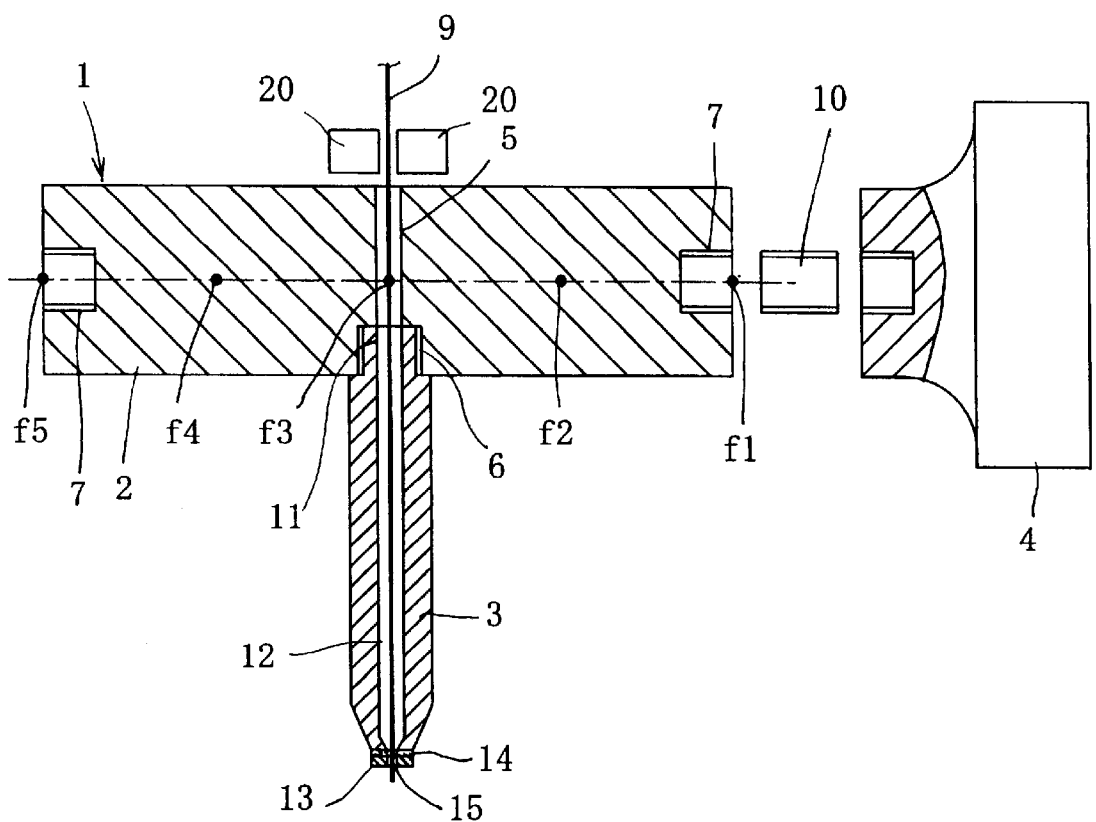
FIG. 1 is a sectional view of the internal structure of a resonator according to an Embodiment of the present invention.
Figure 2:
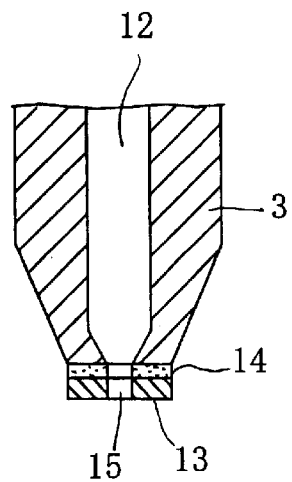
FIG. 2 is a sectional view of the end portion of a capillary according to the Embodiment of the present invention.
Figure 3:
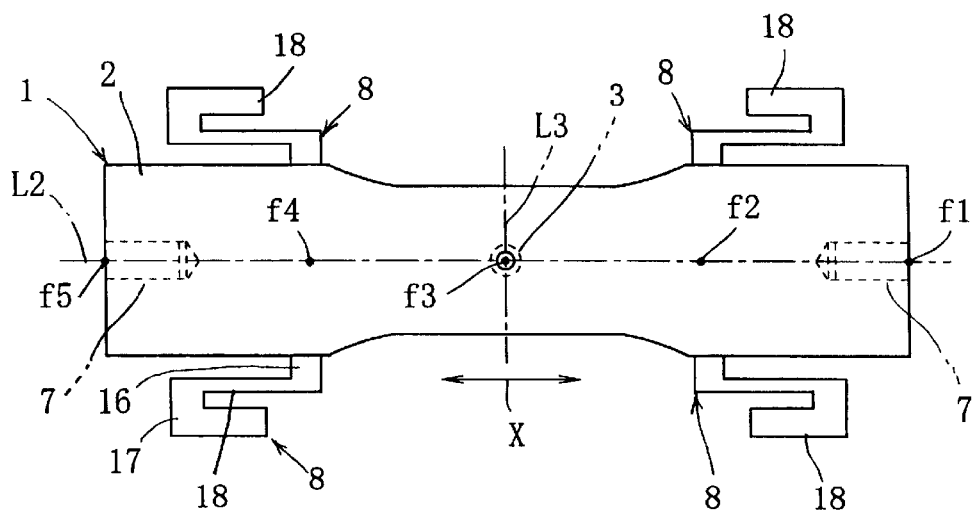
FIG. 3 is a plan view of the resonator of the Embodiment.
Figure 4:
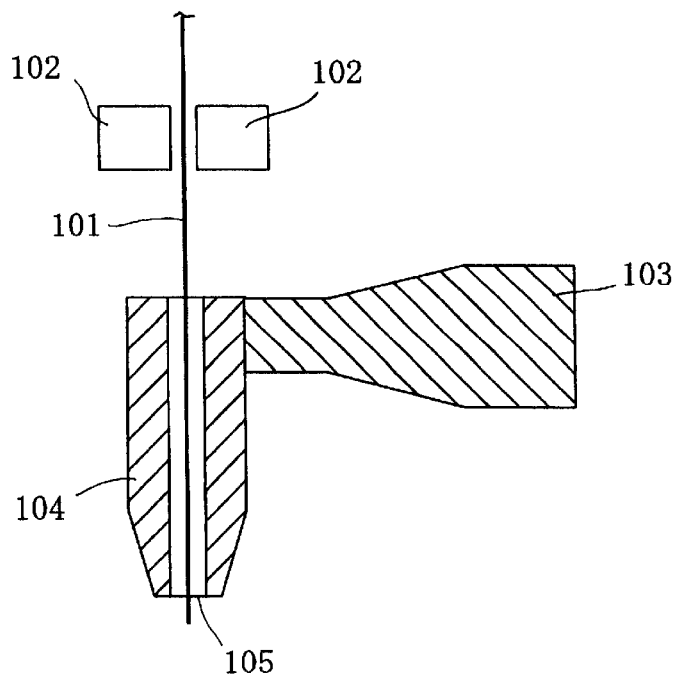
FIG. 4 is a diagram typically showing the prior art.

FIGS. 1 to 3 show an embodiment of the present invention. FIG. 1 is a cross sectional view of a resonator 1, FIG. 2 is a sectional view of the end portion of a capillary 3, and FIG. 3 is a top view of the resonator 1.

With reference to FIG. 1, the key section of the resonator 1 of this embodiment will be described. The resonator 1 comprises an ultrasonic horn 2 and a capillary 3. The ultrasonic horn 2 is shaped like a rod, has a length equal to at least the wavelength of the resonance frequency of ultrasonic vibration transmitted from a transducer 4 (length from the maximum vibration amplitude point f1 to the maximum vibration amplitude point f5), is made from a material having excellent acoustic characteristics such as an aluminum or titanium alloy or hardened iron and is formed as an integral body comprising a wire path 5, a capillary connection portion 6, part connection portions 7 and support portions 8 shown in FIG. 3. The wire path 5 is a through hole formed at the maximum vibration amplitude point f3 of the ultrasonic horn 2 to pass the bonding wire 9 therethrough. The capillary connection portion 6 is a screw hole having a female thread formed coaxially in one end portion of the wire path 5. The part connection portions 7 are a screw hole having a female thread for connecting the transducer 4 or an unshown booster coaxial to the ultrasonic horn 2 by a headless screw 10 and formed in the centers of the right and left end faces existent at the maximum vibration amplitude points f1 and f5 of the ultrasonic horn 2.

The capillary 3 is mounted to the outer under surface of the ultrasonic horn 2 at the maximum vibration amplitude point f3 so as to pass the bonding wire 9 therethrough. The capillary 3 is formed from a material having excellent acoustic characteristics such as an aluminum or titanium alloy or hardened iron as a separate unit from the ultrasonic horn 2, shaped like a straight rod and comprises a connection portion 11 at the top and a wire path 12 extending in an axial direction. The connection portion 11 has a male thread on the peripheral surface. The wire path 12 is formed from the top of the connection portion 11 to the bottom of the capillary 3 by a tool such as a drill, and the lower end portion of the wire path 12 is conical that its diameter becomes smaller toward the lower end, reflecting the shape of the end of the drill as shown in FIG. 2, and extends to the bottom of the capillary 3. By screwing the male screw of the connection portion 11 into the female screw of the capillary connection portion 6, the capillary 3 is attached to the ultrasonic horn 2 such that it projects from the under surface of the ultrasonic horn 2. When the capillary 3 is thus attached to the ultrasonic horn 2, the wire path 12 of the capillary 3 is connected coaxial to the wire path 5 of the ultrasonic horn 2.

A plate-like bonding work portion 13 formed separate from the capillary 3 is bonded to the bottom surface of the capillary 3 by a bonding agent 14 such as wax. The bonding work portion 13 is shaped like a plate and made from super hard steel such as high-speed steel. It is directly bonded to the bottom surface of the capillary 3 by the bonding agent, a small hole 15 is formed in the bonding work portion 13 from the bottom surface toward the capillary 3 by discharge processing, wire processing or water processing, and the bottom surface of the bonding work portion 13 is polished. The small hole 15 is big enough for passing the bonding wire 9 and is connected coaxial to the opening of the wire path 12 extending to the bottom surface of the capillary 3 as shown in FIG. 2.

As shown in FIG. 3, the support portions 8 are located on the front and rear outer sides of the ultrasonic horn 2 at the minimum vibration amplitude points f2 and f4 which are equally distant from the maximum vibration amplitude point f3 in opposite directions so that they are perpendicular to the capillary 3 and mounted to the ultrasonic horn 2 at positions where they are symmetrical about the center line L2 and the center line L3 which passes through the maximum vibration amplitude point f3 and is perpendicular to the center line L2 as symmetrical axes and also symmetrical to each other laterally and longitudinally. Each of the support portions 8 comprises a root portion 16, an intermediate portion 17 and an attachment portion 18. The root portions 16 are shaped like a thick plate projecting outward in a direction perpendicular to the vibration direction X from the ultrasonic horn 2 at the minimum vibration amplitude points f2 and f4. The intermediate portions 17 connect the root portions 16 to the attachment portions 18 and are shaped like a thin plate projecting in a direction parallel to the vibration direction X. The attachment portions 18 are shaped like a thick plate projecting in a direction parallel to the vibration direction X. Cranked support portions each comprising the root portion 16, the intermediate portion 17 and the attachment portion 18 are symmetrical to each other laterally and longitudinally but the right and left support portions may face the same direction. Narrowed portions 19 are formed in the intermediate portion of the ultrasonic horn 2 but may be omitted.

According to the structure of this embodiment, the ultrasonic horn 2 is mounted to an unshown bonding machine by the attachment portions 18 of the support portions 8 located at the minimum vibration amplitude points and equally distant from the capillary 3 in opposite directions in such a manner that it is supported on both sides. In this state, as shown in FIG. 1, the bonding wire 9 is moved down together with the ultrasonic horn 2 and the capillary 3 while it is caused to pass from the wire path 5 in the ultrasonic horn 2 through the damper 20 formed separate from the resonator 1 to the small hole 15 in the bonding work portion 13 through the wire path 12 in the capillary 3 so that the end portion of the bonding wire 9 projecting downward from the end of the bonding work portion 13 is placed upon the electrode of an unshown semiconductor device or lead frame to be bonded and sandwiched between the electrode and the bonding work portion 13 by predetermined pressure.

Since the ultrasonic horn 2 comprises the support portions 8 situated at the minimum vibration amplitude points equally distant from the capillary 3 in opposite directions, the ultrasonic horn 2 is mounted to the unshown bonding machine by the support portions 8 in such a manner that it is supported on both sides, whereby when the end portion of the bonding wire 9 is sandwiched between the electrode to be bonded and the bonding work portion 13 of the capillary 3 by predetermined pressure, the ultrasonic horn 2 is bent by pressure for bonding the bonding wire to the electrode at the bonding position between the bonding wire 9 and the electrode, thereby making it possible to maintain the bonding position between the bonding wire 9 and the electrode accurately.

While the bonding position between the bonding wire 9 and the electrode is maintained accurately, the transducer 4 generates ultrasonic vibration. The ultrasonic horn 4, the capillary 3 and the bonding work portion 13 resonate with this ultrasonic vibration in the direction X shown by the arrow, ultrasonic vibration generated by resonance is applied from the bonding work portion 13 to the end of the bonding wire 9 and the contact portion of the bonding wire 9 with the electrode to be bonded so that the end portion of the bonding wire 9 and the electrode can be bonded together suitably.

In this embodiment, the wire paths 5 and 12 for passing the bonding wire 5 therethrough are formed linearly and vertically in the ultrasonic horn 2 and the capillary 3, respectively. The wire path 5 may be formed outward from the intermediate portion of the ultrasonic horn 2 in a radial direction so that the bonding wire 9 is passed through the small hole 15 from the intermediate portion of the ultrasonic horn 2. Alternatively, the wire path 5 may be omitted from the ultrasonic horn 2 and the wire path 12 may be formed outward from the intermediate portion of the capillary 3 in a radial direction so that the bonding wire 9 is passed through the small hole 15 from the intermediate portion of the capillary 3. Although the bonding work portion 13 is formed separate from the capillary 3, if it is integrated with the capillary 3 as a single unit, is not necessary to bond the bonding work portion to the capillary 3 by the bonding agent 14.

What is claimed is:

1. A resonator for ultrasonic wire bonding, wherein an ultrasonic horn comprises support portions located at minimum vibration amplitude points on both sides of a capillary for passing a bonding wire therethrough.

2. The resonator for ultrasonic wire bonding according to claim 1, wherein said ultrasonic horn is provided with a wire path for passing a bonding wire in said ultrasonic horn, said wire path is positioned at one of maximum vibration amplitude points and is formed so as to penetrate at least a bottom surface of said ultrasonic horn, said capillary has a shape of a straight rod and a wire path for passing said bonding wire is formed in said capillary such that said wire paths in said ultrasonic horn and capillary communicate to each other, and said wire path in said capillary is formed so as to penetrate said capillary in an axial direction of said capillary.

3. The resonator for ultrasonic wire bonding according to claim 1, wherein a wire path formed in said capillary penetrates a lower end of said capillary and has, at lower portion thereof, a shape of corn in which an interior diameter of said wire path is gradually reduced toward an end thereof.

4. The resonator for ultrasonic wire bonding according to claim 1, wherein said ultrasonic horn and said capillary are formed separately, a connection portion is formed on a bottom surface of said ultrasonic horn at a position of one maximum vibration amplitude points of said unltrasonic horn, and a connection portion is formed at an upper portion of said capillary, wherein said ultrasonic horn and said capillary are connected mutually by connecting said connection portions of said ultrasonic horn and said capillary.

5. The resonator for ultrasonic wire bonding according to claim 4, wherein said connection portion of said ultrasonic horn consists of a threaded hole of a female screw and said connection portion of said capillary consists of a male screw, wherein said capillary is fastened to said ultrasonic horn by screwing said male screw into said female screw.

6. The resonator for ultrasonic wire bonding according to claim 1, wherein a bonding work portion is formed separately from said capillary and bonded to a lower end face of said capillary.

7. The resonator for ultrasonic wire bonding according to claim 6, wherein a bonding work portion is made from a super hard steel.

8. The resonator for ultrasonic wire bonding according to claim 6, wherein a bonding work portion having a small aperture for passing said bonding wire is formed separately from said capillary and bonded to said capillary through an adhesive at a bottom surface thereof.

9. The resonator for ultrasonic wire bonding according to claim 8, wherein said adhesive is made from wax.